United States Patent Office 3,521,350
Patented July 21, 1970

3,521,350

METHOD OF MANUFACTURING SEMICONDUCTOR DEVICES

Wilhelmus Franciscus Knippenberg and Gerrit Verspui, Emmasingel, Eindhoven, Netherlands, assignors, by mesne assignments, to U.S. Philips Corporation, New York, N.Y., a corporation of Delaware No Drawing. Filed Mar. 12, 1968, Ser. No. 712,378
Claims priority, application Netherlands, Mar. 14, 1967, 6703802
Int. Cl. H01l *15/02*
U.S. Cl. 29—572 7 Claims

ABSTRACT OF THE DISCLOSURE

This invention relates to the manufacture of semiconductor devices consisting of a coherent foil of an insulating material in which granules of a semiconducting material are embedded in such manner that their surfaces which are free from insulating material protrude on either side of the foil which is covered with electrode layers electrically connecting together protruding portions of the granules.

As is known it is thus possible to obtain diodes and resistors and, as far as the granules consist of semiconducting material which may be active opto-electrically, also photodiodes, photoelectricresistors, EMF-photocells (solar batteries) and p-n light sources.

Methods of manufacturing such semiconductor foils and devices including such foils have already been described in literature, for example, in U.S. patent specifications 3,038,952; 3,210,831 and 3,247,477.

In the manufacture of the relevant foil it is especially important that semiconducting granules of small uniform dimensions are available so that a foil having a high density of active granules can be obtained.

It will mostly not be difficult to obtain granules satisfying the said requirements by grinding and subsequently by sieving or sluicing. Certain semiconductor compounds are, however, so hard or so soft that either they are not easy to grind or they split concoidally during grinding resulting in shell-like particles which are unsuitable for the structure of the relevant foil because of their shape.

The invention is based on recognition of the fact that it is possible in various cases to obtain granules of semiconductor compounds which satisfy the requirements regarding dimensions and uniformity thereof, by starting from granules of a substance which can readily be obtained in small uniform dimensions and by subsequently converting said granules into granules of a semiconductor compound by means of a chemical reaction.

The invention relates to a method of manufacturing a semiconductor device consisting of a coherent foil of an insulating material in which granules of a semiconductor compound are embedded in such manner that their surfaces which are free from insulating material protrude on either side of the foil which is covered with electrode layers electrically connecting together protruding portions of the granules, the invention being characterized in that granules consisting of a component of the semiconductor compound which can readily be formed into granules of small uniform dimensions are converted into granules of the semiconductor compound by means of a chemical reaction, subsequently said granules are incorporated in the foil and finally said foil is processed to form semiconductor devices by applying electrode layers.

The invention may be used for the manufacture of devices having semiconductor compounds of divergent compositions, for example, carbides, phosphides, sulphides and oxides, such as silicon carbide, indium phosphide, cadmium sulphide and ferric oxide.

For the manufacture of granules of semiconductor carbides one may start from carbon granules which are commercially available in uniform small dimensions. Small spherical carbon granules may, for example, be obtained by carbonizing plastic pellets which may be formed during spraying plastics material.

The carbon granules may subsequently be converted in a simple manner into granules of silicon carbide, for example, by reaction with silicon compounds.

For the manufacture of silicon carbide granules one may also start from silicon granules which may be formed in uniform dimensions, for example, by spraying of silicon in an arc plasma in argon. The silicon granules can then further be converted into granules of silicon carbide by means of treatment with carbon or compounds thereof.

Granules of indium and cadmium may, for example, be obtained by spraying the molten metal in a viscous liquid such as silicon oil. Powdered iron is commercially available in various grain sizes but may for that matter also be obtained by spraying of iron in an arc plasma in argon.

The granules of indium, cadmium and iron may subsequently be converted into granules of semiconductor compounds, by means of a reaction with phosphorus, sulphur, oxygen or compounds thereof.

As described above the method according to the invention is advantageous especially in the manufacture of semiconductor devices of the type described, in which compounds are used as semi-conductors which cause difficulties during grinding to the desired dimensions.

In addition the invention gives rise to some further advantages which will be described hereinafter.

It is evident from the above that granules consisting of a component of a semiconductor compound may be formed in many cases by spraying a melt. The granules are then spherical in contrast with granules obtained by grinding which often have very irregular and angular shapes.

Said shapes may also be given to granules of a component of a semiconductor compound and which have been formed through a grinding process, by subjecting said granules to a heating treatment, for example, in a arc plasma in which the granules are rounded off at their surfaces.

The spherical shape of said granules is important because likewise spherical granules of a semiconductor compound may be formed therewith in a simple manner by a chemical reaction. Such granules are advantageous because their spherical shape permits a denser and more even distribution in the foil than is the case if irregular granules obtained by grinding were used. In addition spherical granules evenly protrude throughout the surface of a foil in which they have been incorporated. By using granules of a spherical shape the quality of the semiconductor devices can therefore be increased considerably.

Heat treatments such as are used for the manufacture of spherical granules from a melt or for rounding off ground granules in components of semiconductor compounds according to the invention are generally not permissible for granules of semiconductor compounds. In fact, in the latter case heat treatments, if not carried out under circumstances which are very special and consequently considerably complicate the method, will often stand in the way of the formation of granules of the compounds in an accurate composition.

Although, starting from granules of one of the components, it is possible entirely to convert said granules into the semiconductor compounds by means of a chemical reaction, it may be advantageous that the reaction is not carried through up till the end so that granules are obtained having a core showing properties of conductivity different from those of the converted outside layer. In so far as they consist of metal said cores may more particularly be utilized as contacts in devices composed therewith.

In that case, after the granules have been incorporated in a foil, part of the semiconductor outer layer protruding from the foil must of course be removed up to the core, for example, by grinding off or by etching off.

It may furthermore be important to include additions in the granules of the semiconductor compound which, as donors or acceptors, modify the properties of conductivity. Said additions may be included either during or after the chemical reaction in which the semiconductor compound is formed. In certain cases it is also possible to include an addition in the granules of a component of the compound prior to the chemical reaction in which the compound is formed.

The invention will now be described with reference to a few examples which relate partly to the formation of granules of semiconductor compounds and partly to the further processing of said granules to form semiconductor devices.

EXAMPLE 1

A commercially available carbon powder consisting of spherical granules of "glassy carbon" of ten microns in diameter is intimately mixed with finely ground quartz having a particle size of smaller than 1 micron in a weight ratio of 1:5. After heating in hydrogen at 1500° C. for 20 hours the fine quartz is fully consumed and the carbon granules are fully converted into silicon carbide while maintaining the spherical shape of the granules.

EXAMPLE 2

Of silicon powder obtained by grinding the granules having a size of approximately 75 microns are sieved. Said powder is passed through an argon plasma whereby the granules are rounded off to a more spherical shape.

The silicon granules are mixed with carbon powder of an average particle size of 60 microns in a weight ratio of 1:4. By heating in argon at 1220° C. for 20 hours the silicon granules are completely converted into spherical granules of silicon carbide. The residual carbon is finally removed by firing in air.

EXAMPLE 3

Molten indium is sprayed in silicon oil at a temperature of 200° C. The fraction of granules having a diameter of approximately 50 microns is sieved from the granules obtained. The granules are kept in vibratory motion within a tube in a flow of hydrogen or argon, containing 1% of phosphorus trichloride at a flowspeed of 1 litre per minute and a temperature of 150° C. Complete conversion to indium phosphide granules takes place within approximately 10 hours.

EXAMPLE 4

Silicon granules with an addition of 0.1% of aluminium are worked up to silicon carbide granules in the manner as has been described in Example 2. Said granules contain 0.04% of aluminium and are of p-type conductivity.

EXAMPLE 5

Indium granules having a diameter of 50 microns which have been formed in the manner as described in Example 3 are subsequently reacted with phosphorus trichloride as mentioned therein. After half an hour the reaction is stopped, however. Indium phosphide granules having an indium core are then obtained.

EXAMPLE 6

Silicon carbide granules obtained in accordance with Example 1 are incorporated in a foil of an insulating material in the manner as described in U.S. patent specification 3,247,477 in such manner that their surfaces, which are free from insulating material, protrude on either side of the foil. One side of the foil is provided with an ohmic contact by vapour deposition of gold in a vacuum of $10^{-8}$ mm. The other side is provided with a non-ohmic contact by vapour deposition of gold in a vacuum of $10^{-1}$ mm. Pieces of the foil obtained may be used as voltage-dependent resistors.

EXAMPLE 7

Granules of silicon carbide with an addition of aluminium obtained in accordance with Example 4 are incorporated in an insulating foil as has been described in Example 6. Ohmic contacts are vapour deposited on either side using a gold alloy with 5% of tantalum and 5% of aluminium. Pieces of the foil can be used as resistors having a negative temperature coefficient.

If granules with an addition of phosphorus are used resistors are obtained showing a positive temperature coefficient above room temperature. Such silicon carbide granules doped with phosphorus may be obtained by working up silicon granules with a phosphorus addition in the manner as has been described in Example 4.

What is claimed is:

1. A method of manufacturing semiconductor devices consisting of a coherent foil of an insulating material in which granules of a semiconductor compound are embedded in such manner that their surfaces which are free from insulating material protrude on either side of the foil which is covered with electrode layers electrically connecting together protruding portions of the granules, characterized in that granules consisting of a component of the semiconductor compound which can readily be formed into granules of small uniform dimensions are converted into granules of the semiconductor compound by means of a chemical reaction, subsequently said granules are incorporated in the foil and finally the foil is processed to form semiconductor devices by applying electrode layers.

2. A method as claimed in claim 1, characterized in that spherical granules of a component of a semiconductor compound are converted into the granules of the semiconductor compound while maintaining the spherical shape.

3. A method as claimed in claim 2, characterized in that spherical granules of a component of the compound are formed by spraying a melt.

4. A method as claimed in claim 2, characterized in that granules of a component of the compound and obtained by grinding, are rounded off at their surfaces by means of a heating treatment.

5. A method as claimed in claim 1, characterized in that the granules of a component of the compound are only converted in part so that granules are obtained having a core showing properties of conductivity different from those of the outside layer.

6. A method as claimed in claim 5, characterized in that after embedding the granules in the insulating foil part of the semiconductor layer protruding from the foil is removed up to the core.

7. A method as claimed in claim 1, characterized in that either prior, during or after the chemical reaction additions are incorporated in the granules which as donors or acceptors modify the properties of conductivity of the semiconductor compound.

References Cited

UNITED STATES PATENTS

| | | | |
|---|---|---|---|
| 3,210,831 | 10/1965 | Johnson et al. | 338—327 X |
| 3,247,477 | 4/1966 | Fridrich | 338—310 X |
| 3,329,526 | 7/1967 | Daily et al. | 338—308 X |
| 3,337,365 | 8/1967 | Mones | 338—308 X |

PAUL M. COHEN, Primary Examiner

U.S. Cl. X.R.

29—577, 589, 620; 338—308, 310, 327